United States Patent
Huang et al.

[11] Patent Number: 6,080,527
[45] Date of Patent: Jun. 27, 2000

[54] OPTICAL PROXIMITY CORRECTION OF L AND T SHAPED PATTERNS ON NEGATIVE PHOTORESIST

[75] Inventors: I-Hsiung Huang, Kao-Hsiung; Anseime Chen; Jiunn-Ren Huang, both of Hsinchu, all of Taiwan

[73] Assignee: United Microelectronics Corp., Hsinchu, Taiwan

[21] Appl. No.: 09/442,861

[22] Filed: Nov. 18, 1999

[51] Int. Cl.[7] .................................................. G03F 9/00
[52] U.S. Cl. ................................. 430/296; 430/5; 430/30
[58] Field of Search ................................ 430/5, 296, 30

[56] References Cited

U.S. PATENT DOCUMENTS

| | | | |
|---|---|---|---|
| 5,792,581 | 8/1998 | Ohnuma | 430/30 |
| 5,821,014 | 10/1998 | Chen et al. | 430/30 |
| 5,858,591 | 1/1999 | Lin et al. | 430/30 |
| 5,871,874 | 2/1999 | Tonnai | 430/30 |
| 5,879,844 | 3/1999 | Yamamoto et al. | 430/30 |

*Primary Examiner*—Christopher G. Young
*Attorney, Agent, or Firm*—Hickman Stephens Coleman & Hughes, LLP

[57] ABSTRACT

An optical proximity correction method for rectifying pattern on negative photoresist. Line pattern of integrated circuit is divided into L-shape regions or T-shaped regions. The L-shaped or T-shaped regions are further dissected into rectangular patches. Area of each rectangular patch is suitably reduced and reproduced onto a photomask. The photomask is used to form a corrected photoresist pattern.

3 Claims, 5 Drawing Sheets

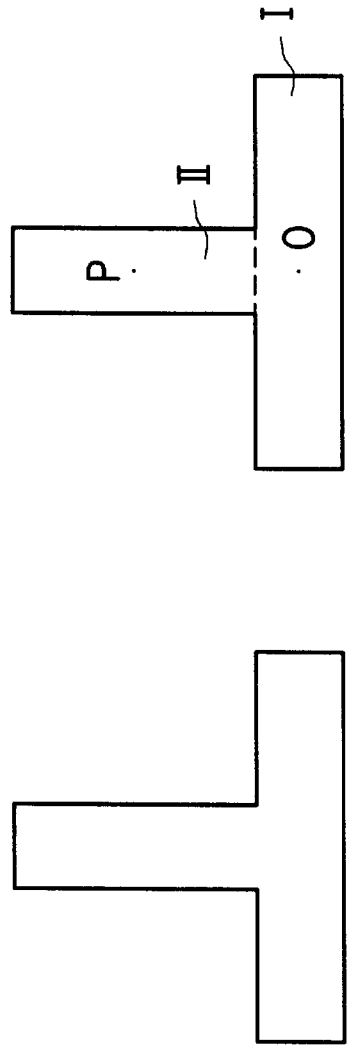
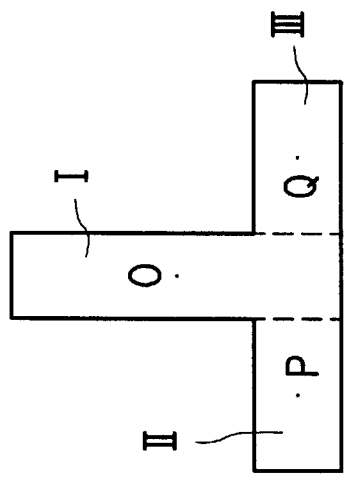
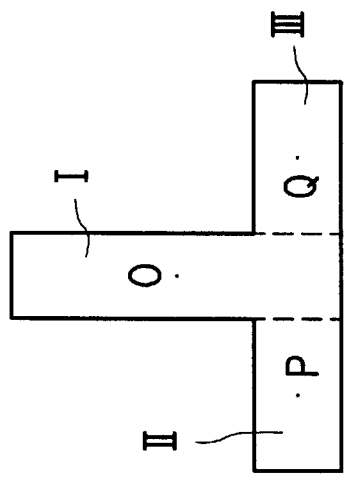
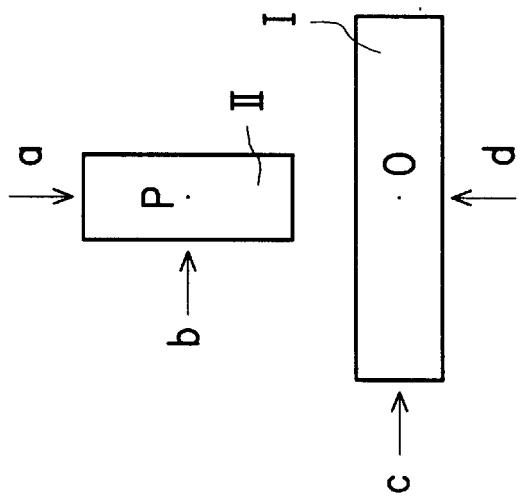
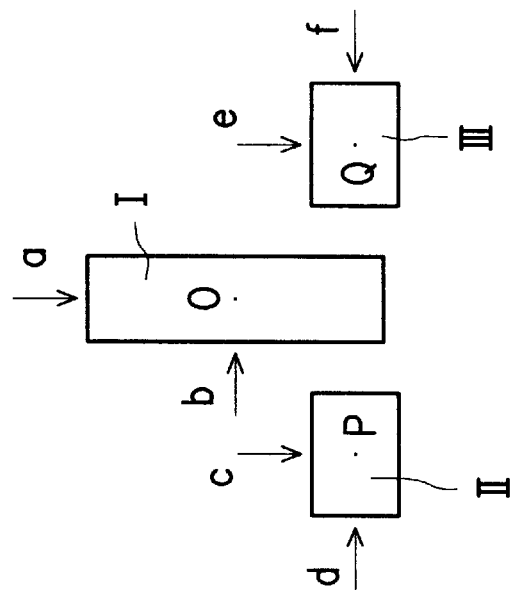

OPTICAL PROXIMITY CORRECTION OF L AND T SHAPED PATTERNS ON NEGATIVE PHOTORESIST

BACKGROUND OF THE INVENTION

1. Field of the Invention

The present invention relates to an optical proximity correction method. More particularly, the present invention relates to an optical proximity correction method for modifying the pattern on a photomask so that a higher photolithographic resolution is obtained.

2. Description of the Related Art

As the level of circuit integration continues to increase, dimensions of each electronic device must be reduced correspondingly. Photolithography is an important process in the fabrication of microelectronic devices on a silicon chip. Most structures associated with the fabrication metal-oxide-semiconductor (MOS) device such as patterned film layers and doped regions are closely related to the resolution of photolithographic processes. In fact, further increases in the level of circuit integration depend on our capacity to pattern out a line width smaller than 0.15 µm in photolithographic processes. To fabricate devices with such a small line width, methods such as optical proximity correction (OPC) and phase shift mask (PSM) have been developed.

The purpose of performing optical proximity correction is to eliminate deviations in critical dimensions from a desired pattern due to proximity of pattern features. Proximity effect occurs when a light beam passes through the pattern of a photomask and projects onto a silicon chip. Due to the dispersion of the incoming light beam by the photomask, a portion of the light beam is diffused. Furthermore, some of the light will be reflected back from the surface of the photoresist layer, resulting in light interference. Consequently, over-exposure of light in some regions of the photoresist layer occurs, resulting in pattern distortion. This phenomenon becomes increasingly dominant as critical dimension decreases and wavelength of the light source approaches the critical dimension.

FIGS. 1A through 1D are schematic top views showing the steps for carrying out conventional optical proximity correction treatment. FIG. 1A is a top view of a photomask 100 showing an integrated circuit pattern with three rectangular masking regions 105 surrounded by a transparent region 110. Structurally, the photomask 100 consists of a chromium layer above a transparent substrate. Materials for forming the transparent substrate include glass and quartz. Area not covered by any chromium forms the transparent region 110, whereas areas covered by the chromium layer become the masking regions 105. FIG. 1B is a top view showing the resulting pattern when light is projected onto a substrate 120 through the photomask 100. A pattern with three dark regions 125 surrounded by a bright region 130 is formed. As shown in FIG. 1A, the original masking region 105 has a rectangular shape. However, the dark regions 125 on the substrate 120 transferred to a photoresist layer (as shown in FIG. 1B) display some shape distortion. Due to the dispersion or diffraction of light near the edges of the chromium layer, corners are smoothed into arcs in addition to a minor reduction of lateral dimensions. Moreover, other types of pattern distortions not shown in the figure are also possible. For example, when pattern density of the photomask is high, some features may merge, or alternatively, some features may deviate from the intended locations.

To compensate for the distortions, masking regions are sometimes expanded in laces next to the corners and edges of the masking region 105. FIG. 1C is a top view showing a photomask with added masking regions 150 and 155. The additional masking region 150 at a corner is called a serif. The serif is able to reduce the degree of arc formation in a pattern after photoresist exposure. The additional masking regions 155 are designed to reduce dimensional reduction due to diffraction or dispersion along the edges of a pattern. FIG. 1D is a top view of the pattern obtained on a substrate 120 after a photomask as shown in FIG. 1C is used in light projection. As shown in FIG. 1D, arcing at the corners of dark regions 125a has improved considerably.

However, the addition of masking areas to the masking pattern is not feasible when distance between neighboring features lines is small or critical dimension has fallen to below 0.15 µm. A bottleneck is encountered because no more space is available for such compensation.

To form a photomask with higher resolution or a photomask with complicated features optical correction using the aforementioned method is difficult. Hence, correction must be carried out with the aid of a computer. In general, data concerning the desired pattern on a semiconductor substrate is first stored inside a computer, and then iterative computation is carried out using conventional computer software. Ultimately, an optimal mask pattern is obtained. The optimal mask pattern is stored inside a computer. Finally, the ideal pattern is used to fabricate the photomask. When a light beam is shone on the photomask, an image that closely resembles the intended pattern is projected onto the semiconductor substrate.

Although computer programming is able to improve resolution of photomask, it can do so only up to a certain limit. For a pattern with ultra-fine features, the desired resolution may exceed the capability of the optical proximity correction method. Moreover, time-consuming computations have to be executed every time some modification to the pattern is need. The amount of time spent in processing large volumes of data and the necessary inspection of photomasks make mass-production of integrated circuits inconvenient.

SUMMARY OF THE INVENTION

The invention provides an optical proximity correction method applied to a photomask for rectifying distortion on negative photoresist. A main pattern at least having an L-shaped patch is first provided. The L-shaped patch is dissected into a first rectangular region and a second rectangular region. The first rectangular region includes the bend of the L-shaped patch. The first rectangular region has a first shape center located in the middle, a pair of parallel first edges and a pair of parallel second edges perpendicular to the first pair. The second rectangular region has a second shape center located in the middle, a pair of third parallel edges and a pair of parallel fourth edges perpendicular to the third pair. Area of the first rectangular region is reduced by shortening the distance from the first shape center to the first and the second edges, respectively. Distance from the first shape center to the respective first edges is reduced by a first length, whereas distance from the first shape center to the respective second edges is reduced by a second length. Similarly, area of the second rectangular region is reduced by reducing the distance from the second shape center to the third and the fourth edges, respectively. Distance from the second shape center to the respective third edges is reduced by a third length, whereas distance from the second shape center to the respective fourth edges is reduced by a fourth length.

In a second embodiment, the invention provides an optical proximity correction method applied to a photomask for rectifying distortion on negative photoresist. A main pattern at least having a T-shaped patch is first provided. The T-shaped patch is dissected into a first rectangular region and a second rectangular region. The first rectangular region includes the intersecting region of the T-shaped patch, and the second rectangular region is attached to the middle portion on one side of the first rectangular region. The first rectangular region has a first shape center located in the middle a pair of parallel first edges and a pair of parallel second edges perpendicular to the first pair. The second rectangular region has a second shape center located in the middle, a pair of parallel third edges and a pair of parallel fourth edges perpendicular to the third pair. Area of the first rectangular region is reduced by shortening the distances from the first shape center to the first and the second edges, respectively. Distance from the first shape center to the respective first edges is reduced by a first length, whereas distance from the first shape center to the respective second edges is reduced by a second length. Similarly, area of the second rectangular region is reduced by shortening the distances from the second shape center to the third and the fourth edges, respectively. Distance from the second shape center to the respective third edges is reduced by a third length, whereas distance from the second shape center to the respective fourth edges is reduced by a fourth length.

In a third embodiment, the invention provides an optical proximity correction method applied to a photomask for rectifying distortion on negative photoresist. A main pattern at least having a T-shaped patch is first provided. The T-shaped patch is dissected into a first rectangular region, a second rectangular region and a third rectangular region. The first rectangular region includes the intersecting region of the T-shaped patch. The second rectangular region and the third rectangular region are attached to each side near the end of the first rectangular region. The first rectangular region has a first shape center located in the middle, a pair of parallel first edges and a pair of parallel second edges perpendicular to the first pair. The second rectangular region has a second shape center located in the middle, a pair of parallel third edges and a pair of parallel fourth edges perpendicular to the third pair. The third rectangular region has a third shape center located in the middle, a pair of parallel fifth edges and a pair of parallel sixth edges perpendicular to the fifth pair. Area of the first rectangular region is reduced by shortening the distances from the first shape center to the first and the second edges, respectively. Distance from the first shape center to the respective first edges is reduced by a first length, whereas distance from the first shape center to the respective second edges is reduced by a second length. Area of the second rectangular region is reduced by shortening the distances from the second shape center to the third and the fourth edges, respectively. Distance from the second shape center to the respective third edges is reduced by a third length, whereas distance from the second shape center to the respective fourth edges is reduced by a fourth length. Area of the third rectangular region is reduced by shortening the distances from the third shape center to the fifth and the sixth edge, respectively. Distance from the third shape center to the respective fifth edges is reduced by a fifth length, whereas distance from the third shape center to the respective sixth edges is reduced by a sixth length.

Following the steps of this invention, an optical proximity corrected pattern can be obtained without too much computation. Furthermore, the corrected pattern comprises rectangular shapes, only. Hence, the method can simplify the production of photomasks and integrated circuits such that critical dimension can be further reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 5A is a schematic top view showing a desired T-shaped pattern over the substrate in the active region of a dynamic random access memory;

FIGS. 5B and 5C are schematic top views showing two methods of dissecting the T-shaped pattern in FIG. 5A;

FIGS. 6A and 6B are schematic top views showing the respective optical proximity corrected layouts of FIGS. 5B and 5C according to a second preferred embodiment of this invention;

DESCRIPTION OF THE PREFERRED EMBODIMENTS

Figure 1A:
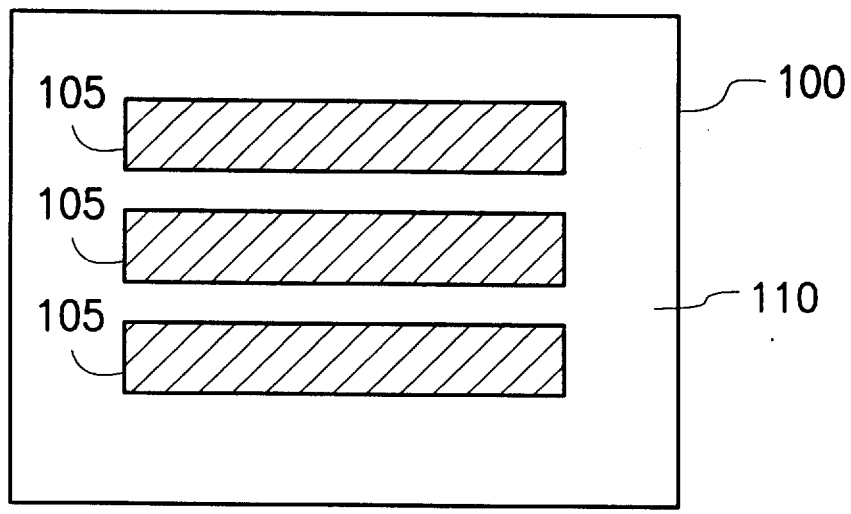
FIGS. 1A through 1D are schematic top views showing the steps for carrying out conventional optical proximity correction treatment.
Figure 1B:
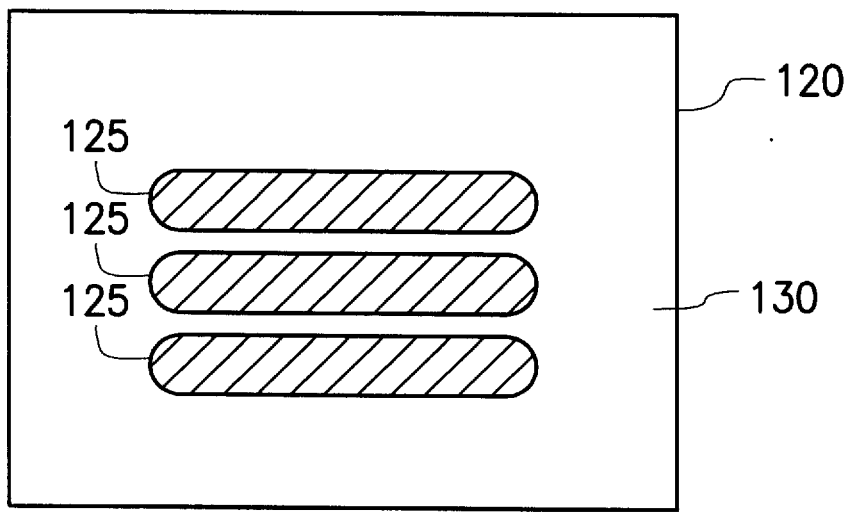
Figure 1C:
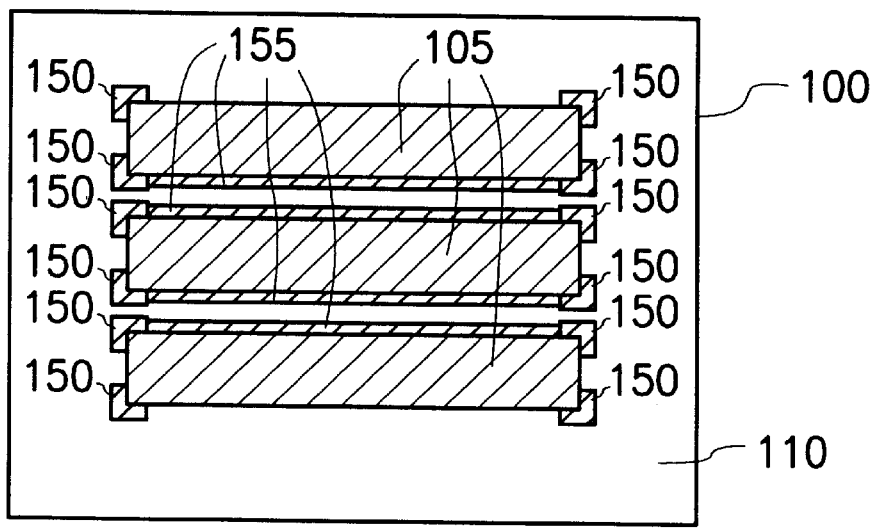
Figure 1D:
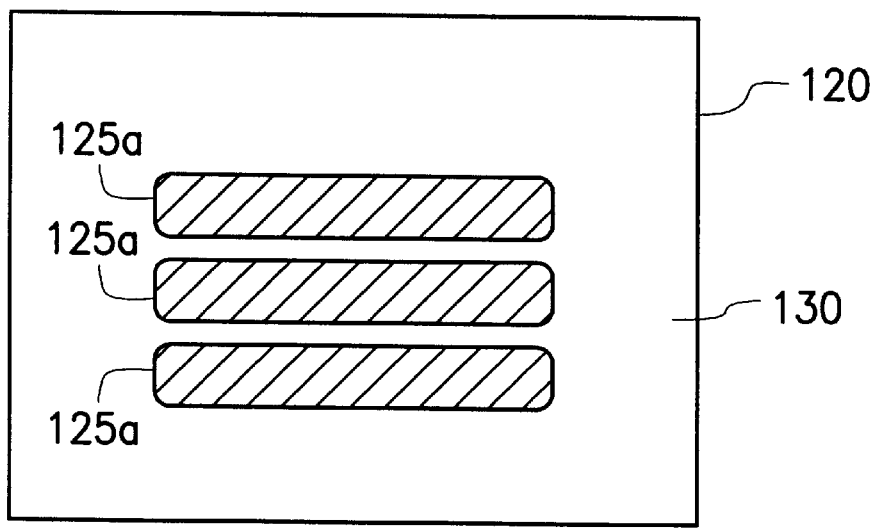

Reference will now be made in detail to the present preferred embodiments of the invention, examples of which are illustrated in the accompanying drawings. Wherever possible, the same reference numbers are used in the drawings and the description to refer to the same or like parts.

In this invention, the photomask is used for forming a light pattern on the negative photoresist material. Hence, the layer retained after development corresponds to the transparent region on the photomask.

Figure 3B:
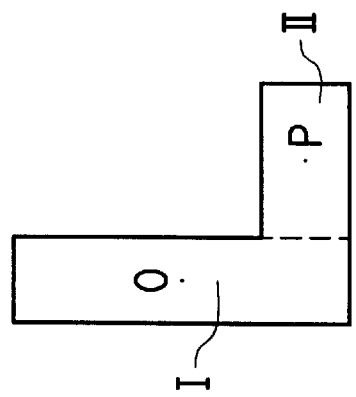
FIGS. 3A and 3B are schematic top views showing two methods of dissecting the L-shaped pattern in FIG. 2.
Figure 3A:
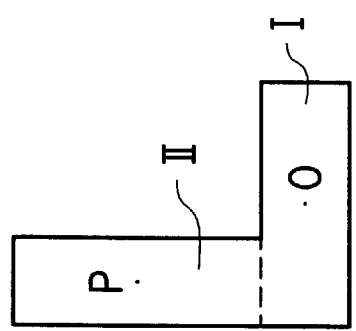
Figure 2:
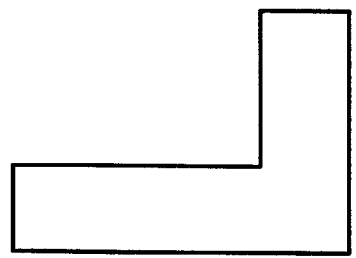
FIG. 2 is a schematic top view showing a desired L-shaped pattern over a substrate.

FIG. 2 is a schematic top view showing a desired L-shaped pattern over a substrate. The L-shaped pattern is first dissected to form two rectangular regions I and II. FIGS. 3A and 3B are schematic top views showing two methods of dissecting the L-shaped pattern in FIG. 2. As shown in FIG. 3B, the rectangular region I includes the corner region of the L-shaped patch. The rectangular region I has a shape center O in the middle. Similarly, the rectangular region II has a shape center P in the middle.

Figure 4B:
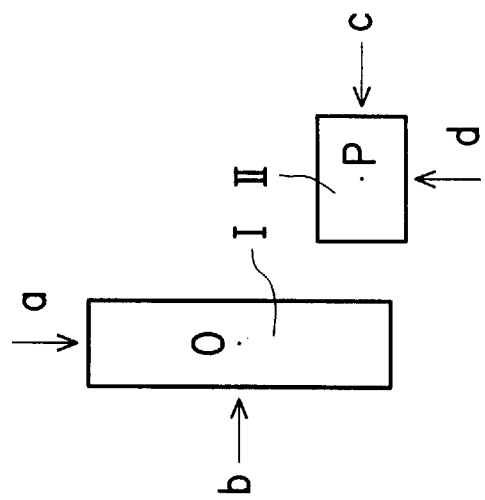
FIGS. 4A and 4B are schematic top views showing the respective optical proximity corrected layouts of FIGS. 3A and 3B according to a first preferred embodiment of this invention.
Figure 4A:
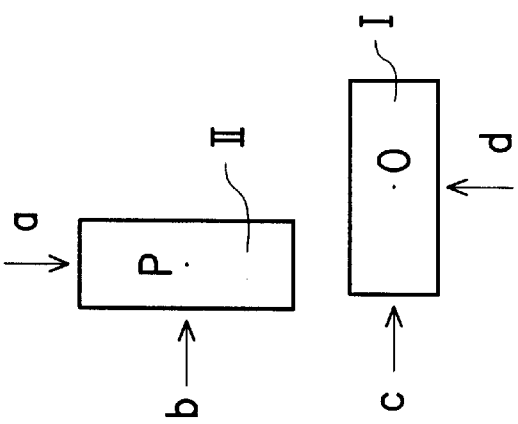

FIGS. 4A and 4B are schematic top views showing the respective optical proximity corrected layouts of FIGS. 3A and 3B according to a first preferred embodiment of this invention. As shown in FIG. 4B, area of the rectangular region I is reduced by shortening the distance from the shape center O to its four edges. One pair of parallel edges moves in towards the shape center O by a distance of a while the other pair of parallel edges moves in towards the shape center O by a distance b. Similarly, area of the rectangular region II is reduced by shortening the distance from the shape center P to its four edges. One pair of parallel edges moves in a distance c while the other pair of parallel edges moves in a distance d. Note that the reduction in distances a, b, c and d need not be equal.

The pattern as shown in FIG. 4A or 4B is reproduced onto a photomask and then the photomask is used to carry out the light exposure of negative photoresist. If the pattern on the photoresist layer matches the desired shape, the photomask pattern is optically correct. On the other hand, if the pattern on the negative photoresist deviates from the desired shape, any one or a combination of the values assigned to a, b, c or d can be varied. Another photomask is formed and then the photomask is used to expose a negative photoresist. The process is repeated until the pattern on the photoresist layer matches the desired shape.

FIG. 5A is a schematic top view showing a desired T-shaped pattern over the substrate in the active region of a dynamic random access memory. FIGS. 5B and 5C are schematic top views showing two methods of dissecting the T-shaped pattern in FIG. 5A.

As shown in FIG. 5B, the I-shaped pattern can be dissected into a first rectangular region I and a second rectangular region 11. The first rectangular region I includes the intersecting region of the T-shaped patch. The second rectangular region II is on one side in the middle of the first rectangular region. The first rectangular region I has a shape center O in the middle. Similarly, the second rectangular region II has a shape center P in the middle.

FIG. 6A is a schematic top view showing the corrected optical proximity layout of FIG. 5B according to a second preferred embodiment of this invention. As shown in FIG. 6A, area of the rectangular region I is reduced by shortening the distance from the shape center O to its four edges. One pair of parallel edges moves in a distance a while the other pair of parallel edges moves in a distance b. Similarly, area of the rectangular region 11 is reduced by shortening the distance from the shape center P to its four edges. One pair of parallel edges moves in a distance c while the other pair of parallel edges moves in a distance d. Note that the reduction in distances a, b, c and d need not be equal.

As shown in FIG. 5C, the T-shaped pattern is dissected into a first rectangular pattern I, a second rectangular pattern II and a third rectangular pattern III. The first rectangular region I includes the intersecting region of the T-shaped patch. The second rectangular region II and the third rectangular region III are on each side near the end of the first rectangular region I. The first rectangular region I has a shape center O in the middle, the second rectangular region 11 has a shape center P in the middle, and the third rectangular region III has a shaped center Q in the middle.

FIGS. 6B is a schematic top view showing the optical proximity corrected layout of FIG. 5C according to a second preferred embodiment of this invention. As shown in FIG. 6B, area of the rectangular region I is reduced by shortening the distance from the shape center O to its four edges. One pair of parallel edges moves in a distance a while the other pair of parallel edges moves in a distance b. Area of the rectangular region II is reduced by shortening the distance from the shape center P to its four edges. One pair of parallel edges moves in a distance c while the other pair of parallel edges moves in a distance d. Similarly, area of the rectangular region III is reduced by shortening the distance from the shape center Q to its four edges. One pair of parallel edges moves in a distance e while the other pair of parallel edges moves in a distance f. Note that the reduction in distances a, b, c, d, e and f need not be equal.

The pattern as shown in FIG. 6A or 6B is reproduced onto a photomask and then the photomask is used to carry out the light exposure of negative photoresist. If the pattern on the photoresist layer matches the desired shape, the photomask pattern is optically correct. On the other hand, if the pattern on the negative photoresist deviates from the desired shape, any one or a combination of the values assigned to a, b, c, d, e and f can be varied. Another photomask is formed and then the photomask is used to expose the negative photoresist. The process is repeated until the pattern on the photoresist layer matches the desired shape.

Figure 7A:
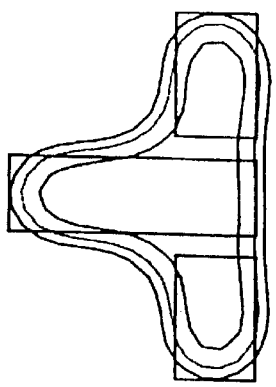
FIGS. 7A through 7C are diagrams showing the distribution of light intensity around patterns having layouts according to FIGS. 5A, 6A and 6B, where the distribution is obtained through a computer simulation with the outer bands showing higher light intensity.
Figure 7B:
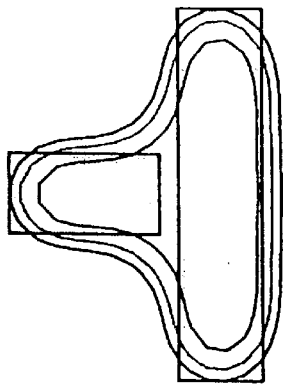
Figure 7C:
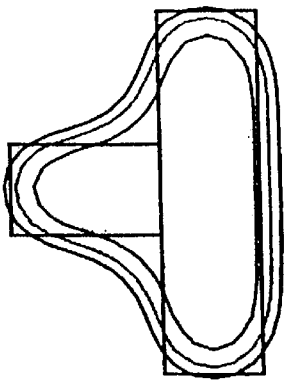

FIGS. 7A through 7C are diagrams showing the distribution of light intensity around patterns having layouts according to FIGS. 5A, 6A and 6B. The distribution is obtained through a computer simulation with the outer bands having a higher light intensity. The contour lines link up places of equal light intensity.

Figure 8A:
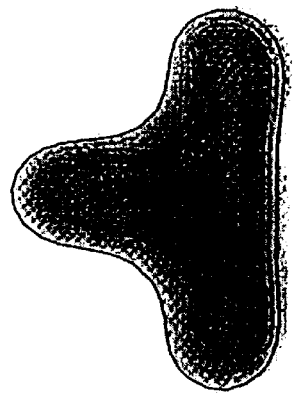
FIGS. 8A through 8C are computer-generated images of the light intensity distribution according to the patterns in FIGS. 7A through 7C, respectively.
Figure 8B:
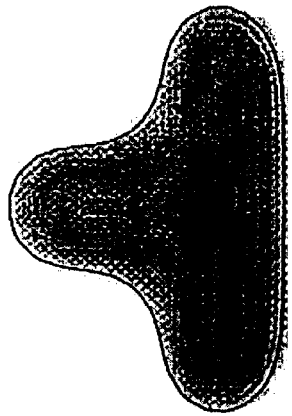
Figure 8C:
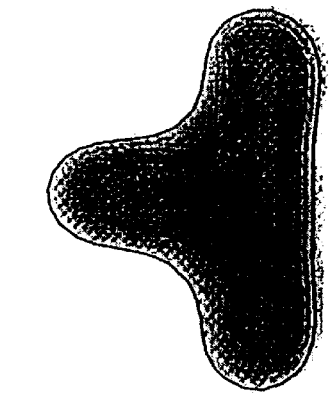

FIGS. 8A through 8C are computer-generated images of the light intensity distribution according to the patterns in FIGS. 7A through 7C, respectively. As shown in FIG. 8A through 8C, the pattern on the negative photoresist improves considerably after treating the photomask according the method of this invention. There is notable difference in the degree of arcing around the corner regions between a pattern formed by a treated photomask (as shown in FIGS. 8B and 8C) and one formed by a conventional photomask.

In summary, the advantages of the invention at least includes:

1. The optical proximity correction of this invention can produce a high-quality pattern without the need to perform a sophisticated computer simulation.

2. The method can effectively eliminate distortion that results from light diffraction and dispersion.

3. Since the components for rectifying pattern on a negative photoresist are simple geometric figures, the photomask can have a higher manufacturing precision.

4. Better control of critical dimension on the photomask or the photoresist can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An optical proximity correction method for rectifying a pattern on a photomask so that a high-quality negative photoresist pattern is produced, comprising the steps of:

providing a main pattern, wherein the main pattern includes at least an L-shaped patch;

dissecting the L-shaped patch into a first rectangular region and a second rectangular region, wherein the first rectangular region has a first shape center, a pair of parallel first edges and a pair of parallel second edges, the second rectangular region has a second shape center, a pair of parallel third edges and a pair of parallel fourth edges, and the first rectangular region contains a bend region of the L-shaped patch;

reducing the area of the first rectangular region through shortening the distance from the first shape center to the first edges by a first length and the distance from the first shape center to the second edges by a second length; and reducing the area of the second rectangular region through shortening the distance from the second shape center to the third edges by a third length and the distance from the second shape center to the fourth edges by a fourth length.

2. An optical proximity correction method for rectifying a pattern on a photomask so that a high-quality negative photoresist pattern is produced, comprising the steps of:

providing a main pattern, wherein the main pattern includes at least a T-shaped patch;

dissecting the T-shaped patch into a first rectangular region and a second rectangular region, wherein the first rectangular region has a first shape center, a pair of parallel first edges and a pair of parallel second edges, the second rectangular region has a second shape center, a pair of parallel third edges and a pair of parallel fourth edges, and the first rectangular region contains an intersecting region of the T-shaped patch while the second rectangular region is attached to one side near the middle of the first rectangular region;

reducing an area of the first rectangular region through shortening a distance from the first shape center to the first edges by a first length and a distance from the first shape center to the second edges by a second length; and reducing an area of the second rectangular region through shortening the distance from the second shape center to the third edges by a third length and a distance from the second shape center to the fourth edges by a fourth length.

3. An optical proximity correction method for rectifying a pattern on a photomask so that a high-quality negative photoresist pattern is produced, comprising the steps of:

providing a main pattern, wherein the main pattern includes at least a T-shaped patch;

dissecting the T-shaped patch into a first rectangular region, a second rectangular region and a third rectangular region, wherein the first rectangular region has a first shape center, a pair of parallel first edges and a pair of parallel second edges, the second rectangular region has a second shape center, a pair of parallel third edges and a pair of parallel fourth edges, the third rectangular region has a third shape center, a pair of parallel fifth edges and a pair of parallel sixth edges, and the first rectangular region contains an intersecting region of the T-shaped patch while the second and the second rectangular region are attached to opposite sides near the end of the first rectangular region;

reducing an area of the first rectangular region by shortening a distance from the first shape center to the first edges by a first length and the distance from the first shape center to the second edges by a second length;

reducing an area of the second rectangular region by shortening a distance from the second shape center to the third edges by a third length and a distance from the second shape center to the fourth edges by a fourth length; and reducing the area of the third rectangular region through shortening the distance from the third shape center to the fifth edges by a fifth length and the distance from the third shape center to the sixth edges by a sixth length.

* * * * *